US010521534B2

(12) United States Patent
Meyer (10) Patent No.: US 10,521,534 B2
(45) Date of Patent: Dec. 31, 2019

(54) SIMULATION CIRCUIT APPARATUS AND METHOD FOR SIMULATING ELECTRICAL LOAD FOR USE IN TESTING POWER CONTROL DEVICE (71) Applicant: dSPACE digital signal processing and control engineering GmbH, Paderborn (DE)

(72) Inventor: Gerrit Meyer, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 339 days.

(21) Appl. No.: 15/408,758

(22) Filed: Jan. 18, 2017

(65) Prior Publication Data

US 2017/0206296 A1    Jul. 20, 2017

(30) Foreign Application Priority Data

Jan. 19, 2016  (DE) .......................... 10 2016 100 771
May 13, 2016  (DE) .......................... 10 2016 108 933
May 30, 2016  (EP) ..................................... 16171914

(51) Int. Cl.
*G06F 17/50*     (2006.01)
*H03K 4/06*      (2006.01)
(Continued)

(52) U.S. Cl.
CPC ......... *G06F 17/5036* (2013.01); *G05B 17/02* (2013.01); *H03K 4/06* (2013.01); *H03K 4/08* (2013.01); *G05B 2219/23446* (2013.01)

(58) Field of Classification Search
CPC ................ G06F 17/5036; G05B 17/02; G05B 2219/23446; H03K 4/06; H03K 4/08
(Continued)

(56) References Cited

U.S. PATENT DOCUMENTS 5,038,247 A * 8/1991 Kelley ................. H01H 47/325
                                                                361/152
8,108,191 B1 * 1/2012 Britch ................. G06F 17/5009
                                                                703/13
(Continued)

FOREIGN PATENT DOCUMENTS

DE    10 2005 048 464 A1    4/2007
DE    10 2008 034 109 A1    2/2010
(Continued)

OTHER PUBLICATIONS

M. N. Kokate et. al., "Comparison of Simulation Results Three Level and Five Level H-bridge Inverter and hardware implementation of Single Leg H-Bridge Three Level Inverter," International Journal of Innovative Research & Studies, vol. 2, Issue 4, Apr. 2013, pp. 389-403 (Year: 2013).*
(Continued)

*Primary Examiner* — Eunhee Kim
(74) *Attorney, Agent, or Firm* — Muncy, Geissler, Olds & Lowe, P.C.

(57) ABSTRACT

A simulation device for simulating a peripheral circuit arrangement that can be connected to a control device, wherein the simulation device can be electrically connected to the control device, and the simulation device has a first control element for influencing a first simulation current that can be passed from a first load terminal of the control device to a first control element output of the first control element. The first control element contains a first multistage converter that includes a first converter output, which is electrically connected to a terminal on the converter side of a first inductive component at whose terminal on the control device side the first control element output is implemented. A direction of flow of the first simulation current is revers-
(Continued)

ible, and the simulation device also includes a computing unit for execution of model code.

17 Claims, 3 Drawing Sheets

(51) Int. Cl.
*H03K 4/08* (2006.01)
*G05B 17/02* (2006.01)

(58) Field of Classification Search
USPC .................................................. 703/23, 24
See application file for complete search history.

(56) References Cited

U.S. PATENT DOCUMENTS

| | | | |
|---|---|---|---|
| 8,587,322 B2* | 11/2013 | Peterson | G01R 31/42 324/511 |
| 8,754,663 B2 | 6/2014 | Schulte et al. | |
| 8,768,675 B2* | 7/2014 | Bracker | G05F 1/625 703/13 |
| 9,020,798 B2 | 4/2015 | Haupt et al. | |
| 9,576,086 B2* | 2/2017 | Chiang | G06F 17/5009 |
| 10,074,978 B2* | 9/2018 | Geyer | H02M 7/53873 |
| 2010/0039120 A1 | 2/2010 | Plude et al. | |
| 2011/0133763 A1 | 6/2011 | Schulte et al. | |
| 2012/0105072 A1 | 5/2012 | Peterson | |
| 2012/0150503 A1 | 6/2012 | Haupt et al. | |
| 2013/0346052 A1* | 12/2013 | Valerio | G06F 17/5036 703/13 |
| 2014/0268967 A1 | 9/2014 | White et al. | |
| 2016/0036326 A1* | 2/2016 | Sreenivas | H02M 3/158 323/271 |
| 2017/0227937 A1* | 8/2017 | Batliner | G05B 13/04 |

FOREIGN PATENT DOCUMENTS

| | | |
|---|---|---|
| DE | 10 2014 105 501 A1 | 10/2015 |
| WO | WO 2007/042228 A1 | 4/2007 |
| WO | WO 2010/010022 A1 | 1/2010 |
| WO | WO 2015/165848 A1 | 11/2015 |

OTHER PUBLICATIONS

J. Rodriguez et. al., "Multilevel Inverters: A Survey of Topologies, Controls, and Applications," IEEE Transactions on Industrial Electronics, vol. 49, No. 4, Aug. 2002, pp. 724-738 (Year: 2002).*
Extended European Search Report for European Application No. 16171912.5 dated Jun. 19, 2017 with English translation.
Extended European Search Report for European Application No. 16171914.1 dated Jun. 13, 2017 with English translation.
German Search Report for German Application No. 102016100771.4 dated Sep. 29, 2016 with English translation.
German Search Report for German Application No. 102016108933.8 dated Jan. 27, 2017 with English translation.
Rodriguez et al., "Multilevel Inverters: A Survey of Topologies, Controls, and Applications," IEEE Trans. on Ind. Elec., vol. 49, No. 4, pp. 724-738 (Aug. 2002).
Kokate et al., "Comparison of Simulation Results Three Level and Five Level H-bridge Inverter and hardware implementation of Single Leg H-Bridge Three Level Inverter," Int'l J. of Innovative Res. Studies, vol. 2.4, pp. 389-402 (2013).

* cited by examiner

SIMULATION CIRCUIT APPARATUS AND METHOD FOR SIMULATING ELECTRICAL LOAD FOR USE IN TESTING POWER CONTROL DEVICE

This nonprovisional application claims priority under 35 U.S.C. § 119(a) to German Patent Application No. 10 2016 100 771.4, which was filed in Germany on Jan. 19, 2016, German Patent Application No. 10 2016 108 933.8, which was filed in Germany on May 13, 2016, and European Patent Application No. 16171914.1, which was filed in Europe on May 30, 2016, and which are herein incorporated by reference.

BACKGROUND OF THE INVENTION

Field of the Invention

The invention relates to a simulation device for simulating a peripheral circuit arrangement that can be connected to a control device and a method for simulating a peripheral circuit arrangement that can be connected to a control device.

Description of the Background Art

A circuit for emulating—which is to say for simulating—an electrical load at a terminal of a test circuit is known from the WO 2010 010022 A1, which corresponds to U.S. Pat. No. 8,754,663, and which is incorporated herein by reference. Some elements of FIG. 3 of the aforementioned PCT document are appended to the present document as FIG. 1c for better understanding of the prior art. Said document proposes, in particular, a controllable voltage source as a four-quadrant switching device 17 with an internal voltage source 18. A current flowing from the four-quadrant switching device 17 to the test circuit 3 can be coupled in, more particularly via inductance 14 of a bridge shunt arm.

Depending on the requirements for the dynamics of the circuit for simulation, and depending on the nature of the requirements for avoiding or at least reducing an unwanted superposition of ripple currents on the current in the bridge shunt arm or superposition of an unwanted—possibly high-frequency—AC current on the current in the bridge shunt arm, conventional controllable voltage sources could prove to be inadequate for highly precise simulation applications.

Figure 1A:
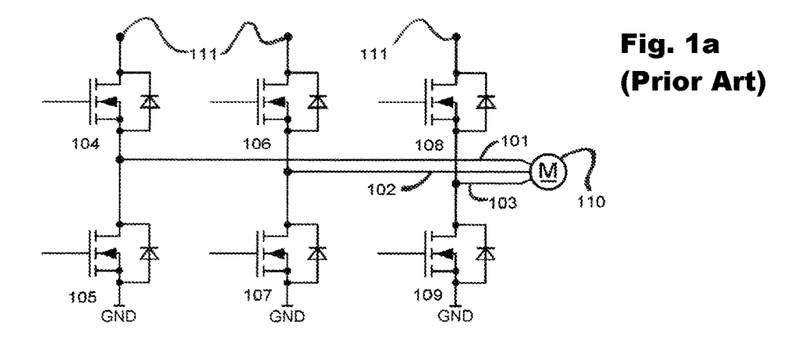
FIG. 1a is a schematic view of a circuit arrangement known from the prior art for driving a three-phase electric motor 110, wherein each half-bridge of a total of three half-bridges is connected to one phase terminal of the electric motor.

It is a part of general technical knowledge that a multi-phase, in particular three-phase electrical load, for example an electric motor 110 from FIG. 1a, implemented here as a three-phase electric motor, can be connected to a supply circuit, wherein one associated half-bridge circuit for each phase, for instance, can be connected to the relevant phase for current control. FIG. 1a shows an example from the prior art, in which the three phases 101, 102, 103 of an electric motor 110 are supplied by means of a first half-bridge 104, 105, a second half-bridge 106, 107, and a third half-bridge 108, 109, wherein these three half-bridges are composed of field-effect transistors 104, 105, 106, 107, 108, 109, abbreviated as FETs. The drain terminals of the FETs 104, 106, 108 are connected to a common operating voltage 111. The source terminals of the FETs 105, 107, 109 are connected to a common reference voltage GND. The three half-bridges from FIG. 1a are integrated into, for instance, a control device that drives the electric motor 110.

Figure 1B:
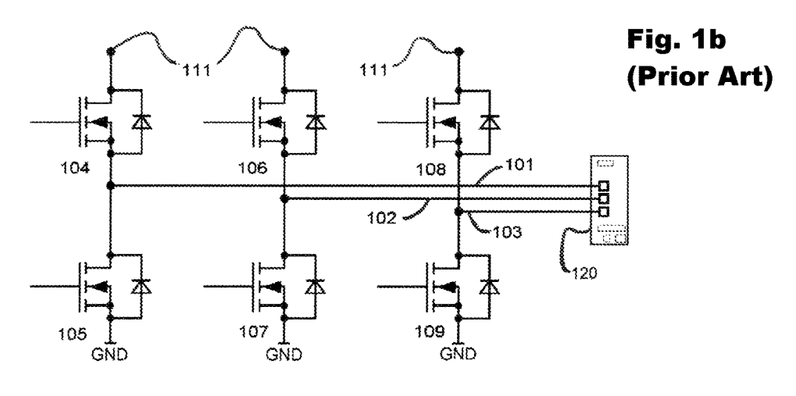
FIG. 1b is a schematic view of a circuit arrangement known from the prior art having firstly three half-bridges such as are contained in known control devices, and secondly an electric motor simulation device 120.

FIG. 1b differs to FIG. 1a in that the electric motor 110 is replaced by an electric motor simulation device 120. It is an approach generally known from the prior art to replace a peripheral circuit arrangement, for example the electric motor 110 from FIG. 1a, with a simulation device, for example an electric motor simulation device 120 from FIG. 1b, for test purposes. A problem frequently encountered with prior art electric motor simulation devices is that they either do not adequately emulate reality, or the prior art electric motor simulation devices cannot be retrofitted with sufficient flexibility to changed electric motors that are to be simulated, or else such retrofits require very extensive hardware changes that are time-consuming.

An appropriate test environment, for example, a simulation device, is frequently used for testing of a control unit or a control device that is to be connected to a peripheral circuit arrangement, for example an electrical load, perhaps an electric motor, in an intended later application.

It is known that an expert active in the technical field mentioned at the outset who wishes to provide a simulation device for simulating a peripheral circuit arrangement that can be connected to a control device oftentimes makes use of a simulation device that includes a computing unit on which executable model code is installed. The model code is based on a mathematical model of the peripheral circuit arrangement. The mathematical model is transformed into model code that can be executed on a computing unit, for instance in a method comprising multiple steps, for example including programming, so-called code generation, and a translation step.

By means of cyclic execution, which is to say cyclic processing, of the model code, predefined output variables are cyclically computed as a function of input variables; these output variables can be used or processed further, for example, to provide voltages and/or currents for simulation purposes.

Testing with the use of a simulation device can in particular offer the advantage that the control unit or the control device can be functionally tested without the need for the control unit or the control device to be placed in its "actual" operating environment. In the above-described context, the control device under test, often referred to as the "control unit" under test, is frequently referred to as the "device under test," abbreviated as "DUT." Frequently, the control device or DUT is connected electrically to a suitably configured simulation device in order to test whether the control device responds in the desired manner, which is to say whether the control device responds to specific state variables received through its interfaces with an appropriate output of output variables that are output through its interfaces. The relevant environment of a control device is fully or partially simulated for this purpose.

In generally recognized test scenarios, the environment to be emulated of the control device under test also includes power electronic components, in particular. For example, testing of a control device may make it necessary to provide an emulation, which is to say a simulation, of an electric motor or another electrical load, which also includes, in particular, an inductance simulation. In general, environments of this type can be simulated in software as well as by means of hardware. Frequently, a simulation device, specially designed hardware, and specially adapted simulation software are employed for testing of a control device with power electronic outputs and/or inputs.

Remaining with this example of a simulated electrical load, a distinctive feature of the simulation of an inductive load resides, in particular, in that it is necessary to take into account in the simulation that a change in the magnetic flux density passing through the corresponding actual inductive load, such as can be caused by a switching operation in the control device, results in an induced voltage. The accompanying nonlinear current and voltage curves should be emulated as realistically as possible in the simulation of the electrical load. In other words, the simulation device used in the test phase of the control device should reflect as closely as possible the behavior of an "actual" inductive load that occurs in the later phase of actual practice.

The simulation devices heretofore available, in particular the simulation devices suitable for so-called "hardware-in-the-loop simulation," abbreviated "HIL simulation," are lacking in adequate scalability and adaptability, which is to say that the scaling and adapting of previous simulation devices, for the purpose of, e.g., adaptation of the simulation device to different inductive loads to be simulated, requires extensive hardware changes in many cases. Frequently, it has only been possible heretofore to solve the problems resulting from the described inadequate scalability and inadequate adaptability through rebuilding or retrofitting work on the simulation device, especially when the electrotechnical parameters of the inductive loads to be successively simulated differ greatly from one another.

There is a need in the industry and in research and development, especially in product development and quality assurance, for an improved simulation device for simulating a peripheral circuit arrangement, for example for simulating an inductive load.

The simulation of the dynamic behavior of the inductive load by means of model code is often subject to requirements such that the model variables that belong to the model code and are to be computed cyclically must, for example, be computable in execution times in the range of a few milliseconds or even only a few microseconds. In this context, an execution time means the period of time that a computing unit requires in order to process a simulation model code once. In other words, the model code is cyclically executed during a simulation, wherein preferably each processing of the model code takes place within a predefined execution time, and the processing of the model code is essentially repeated for as long as the simulation runs. A model-based simulation such as takes place on the said simulation device presupposes a cyclic—which is to say a repeatedly executable—processing of the model code on the computing unit of the simulation device. Generally speaking, a use of computer-assisted simulation models and a use of associated executable model codes is known, with which the aforementioned execution times for cyclic model code processing can be ensured, namely simulation models, for example, that can be created by means of a numerical development and simulation environment. One example of a development and simulation environment including a graphical programming environment is the software product SIMULINK from the firm The MathWorks. One example of the generation of executable model code, for example by means of the software product SIMULINK, is mentioned in the U.S. Pat. No. 9,020,798 B2, which is incorporated herein by reference.

However, in practice it frequently is not sufficient to merely provide the model variables for describing the dynamically changing state of the inductive load within the predefined execution time by means of the model code; rather, it may be necessary, for example, to carry out the simulation of the peripheral circuit arrangement, for example the simulation of the inductive load, in such a manner that particularly voltages and/or currents are provided at the electrical connection points between the simulation device and the control device(s) that have a high degree of agreement with the dynamically changing voltages and/or currents in an "actual", which is to say not simulated, peripheral circuit arrangement. The non-simulated peripheral circuit arrangement includes an inductive load, for example.

In other words, it is a requirement to provide the user of the simulation device with a device that is equipped to provide, at the designated electrical terminals of the simulation device, appropriate currents and/or voltages for the control device that in each case exhibit only predefined maximum permissible deviations from the corresponding currents and/or voltages of a later application of the control device.

SUMMARY OF THE INVENTION

It is therefore an object of the invention to provide a simulation device and a method for simulating a peripheral circuit arrangement that can be connected to a control device, which advance the state of the art. The stated problems or disadvantages of the prior art should preferably be at least partially avoided or reduced.

According to an exemplary embodiment of the invention, a simulation device for simulating a peripheral circuit arrangement that can be connected to a control device is proposed, wherein the simulation device is electrically connected or can be electrically connected to the control device, and the simulation device has a first control element for influencing a first simulation current that can be passed from a first load terminal of the control device to a first control element output of the first control element, and wherein the first control element contains a first multistage converter, and wherein the first multistage converter includes a first converter output, wherein the first converter output is provided and equipped to be electrically connected to a terminal on the converter side of a first inductive component at whose terminal on the control device side the first control element output is implemented, and wherein the direction of flow of the first simulation current is reversible, and the simulation device also includes a computing unit for execution of model code, wherein by means of the model code that is stored and executable on the computing unit, a first switch control signal can be provided for forwarding to a first semiconductor switch control, and wherein the first semiconductor switch control is provided and equipped to convert the first switch control signal into at least a first modified switch control signal and to apply at least the first modified switch control signal to the first multistage converter.

Also proposed in accordance with the invention is a method for simulating a peripheral circuit arrangement that can be connected to a control device, wherein a simulation device is electrically connected or can be electrically connected to the control device, and wherein the simulation device has a first control element with which a first simulation current that can be passed from a first load terminal of the control device to a first control element output of the first control element is influenced, and wherein the first control element contains a first multistage converter, and wherein the first multistage converter includes a first converter output, wherein, connected to the first converter output, is a first inductive component at whose terminal on the control device side the first control element output is implemented, and wherein the direction of flow of the first simulation current is reversed by voltage change at the first control element output, and the simulation device also includes a computing unit that executes model code, wherein by means of the model code executed on the computing unit, a first switch control signal is provided for forwarding to a first semiconductor switch control, and wherein the first semiconductor switch control converts the first switch control signal into at least a first modified switch control signal, and at least the first modified switch control signal is applied to the first multistage converter, wherein a first output voltage influenced by the model code is provided at the first control element output connected to the first multistage converter.

It should be noted that a peripheral circuit arrangement can be understood within the scope of the invention to mean any desired electrical load that can be attached to a control device, for example an electric motor or other electromechanical actuator.

One of the advantages of the invention, namely an improved, which is to say more realistic simulation, frequently becomes evident in applications where the peripheral circuit arrangement to be simulated is not "only" an ohmic resistance, because the simulation device according to the invention primarily serves the purpose of providing nonlinear current and voltage curves with changing current directions, for example in order to thus simulate a current from a control device to an "actual" motor winding or another complex peripheral circuit arrangement—but one that is not connected to the control device during the simulation. The more realistic the simulation of the electrical behavior of the peripheral circuit arrangement is, the more meaningful the test results are that are produced in an interaction of the simulation device with the connected control device being tested. Illustrated using the example of the first simulation current, this means that the more the first simulation current matches a current in the subsequent "actual" operating mode that flows from the control device to the "actual" peripheral circuit arrangement, which is to say to the "actual" motor winding, for example, the better the controller characteristics of the control device can be tested, and consequently optimized after the test or between multiple tests.

The model code can be a computer program that is executable on the computing unit, wherein it is essentially immaterial whether the model code is first translated in the course of execution, for example by means of an interpreter, or whether the model code is already present in a format that is executable by the computing unit without further translation. The computing unit preferably includes a computing unit microprocessor or a computing unit microcontroller or an IP core, integrated on an FPGA, for example. One of the tasks of the computing unit associated with the simulation device is the generation of the first switch control signal by means of the executable model code, something that is discussed in greater detail below.

The first load terminal of the control device is an electrical interface that is implemented by the control device. An electrical load that is connected to the first load terminal is supplied with a current through the first load terminal, wherein this current flows either in the direction of the control device or in the direction of the load connected to the control device, depending on what time-varying electrical potential gradient has arisen between the first load terminal and the first control element output of the simulation device. The first simulation current is the electric current that flows either from the first load terminal of the control device to the first control element output of the simulation device or from the first control element output of the simulation device to the first load terminal of the control device.

The electrical load, also referred to herein as a peripheral circuit arrangement, can be replaced for test purposes by a simulated peripheral circuit arrangement, namely the simulation device.

The first control element includes a first multistage converter, which preferably has at least a first, a second, a third, a fourth semiconductor switch for influencing the first simulation current. It is additionally preferred that, during a running simulation, a corresponding signal originating from the first semiconductor switch control is applied to each of the last-mentioned four semiconductor switches via the control terminal of the applicable semiconductor switch, which process is discussed in greater detail below. The first multistage converter has a first converter output through which at least a part of the first simulation current flows.

The first control element output according to the present teaching is an interface of the simulation device, wherein this interface represents a connection established via the first inductive component to the first converter output of the first multistage converter. The first output voltage of the first control element, which is influenced by the model code executed on the computing unit, is present at the first control element output. When a connection is established from the first control element output to the first load terminal of the control device, a simulation current influenced by the model code flows through this connection in a direction influenced by the model code.

Preferably the first control element includes at least four semiconductor switches, each of which is placed in a conductive or a non-conductive state by way of a corresponding first modified switch control signal of the first semiconductor switch control, wherein a specially designed time behavior of the conductive and non-conductive states is brought about for each of the four semiconductor switches of the first control element. In other words, the time behaviors of the switching states of the four semiconductor switches of the first control element are different.

The first multistage converter provided in accordance with the invention, which is a component of the first control element, has semiconductor switches, wherein the semiconductor switches preferably are implemented as field-effect transistors, often abbreviated as "FETs," for example so-called power field-effect transistors, or as so-called silicon carbide JFET components, abbreviated as SiC-JFETs, or as bipolar transistors, or as so-called IGBT components, i.e., bipolar transistors with insulated gate electrodes (IGBT is derived from the term "insulated-gate bipolar transistor").

The first multistage converter preferably is equipped to provide an output voltage at its first converter output whose maximum value is less than or equal to the value of a third supply voltage, and whose minimum value is greater than or equal to the value of a first supply voltage, and the output voltage additionally can assume a value that corresponds to a second supply voltage, where the following quantity relations apply: the third supply voltage is greater than the second supply voltage, and the second supply voltage is greater than the first supply voltage. The first supply voltage, the second supply voltage, and the third supply voltage provide power to the first control element and thus to the first multistage converter.

If the first multistage converter, according to a preferred embodiment of the first control element, includes four semiconductor switches, then provision is made that a voltage that is between the third supply voltage and the first supply voltage can be established at the first converter output through timed control of the four semiconductor switches of the first control element. For the purposes of providing a required voltage at the first converter output, at least one first modified switch control signal that is based on the calculation using the model code must be applied to the control terminals of the first control element during a running simulation of the peripheral circuit arrangement.

During a running simulation of the peripheral circuit arrangement, it is preferred for the first modified switch control signal to be electrically applied to four control terminals of the first control element. The first modified switch control signal preferably includes four gate-source voltages, which preferably have different voltage values. In other words, it is preferred that each gate-source voltage of the four gate-source voltages is electrically applied to one of the preferably four control terminals of the first control element.

In an embodiment of the simulation device, provision is made that additional predefined data originating from the control device are made available by the control device to the computing unit of the simulation device in parallel with the cyclic execution of the model code, and these data are provided in order to be taken into account in the cyclic execution of the model code. In other words, the last-mentioned embodiment of the simulation device is equipped to use data from the control device as input variables in the calculations of the model code. A suitable interface of the control device for providing data originating from the control device for the purpose of forwarding it to the computing unit of the simulation device is, on the control device side, a so-called debug interface, for example a standardized JTAG or Nexus interface.

An embodiment of the simulation device according to the invention has, in addition to the first control element, a second control element and a third control element.

In the last-mentioned improvement of the invention, provision is made that the second control element is implemented as a second multistage converter and/or the third control element is implemented as a third multistage converter. The phrase "additional multistage converters" in the text below conceptually combines at least the second multistage converter and the third multistage converter, but this is not intended to convey, however, that a simulation device that has two or four or more than four multistage converters cannot be a useful improvement of the invention. The additional multistage converters preferably are connected to the first supply voltage, to the second supply voltage, and to the third supply voltage.

In addition, it is preferred that the additional multistage converters, for example the second multistage converter of the second control element and the multistage converter of the third control element, have a hardware structure that is essentially the same as or that is identical to that of the first multistage converter of the first control element.

It is proposed within the scope of the present teaching to preferably implement the first multistage converter and/or the additional multistage converters as three-stage converters in each case. A three-stage converter is distinguished by the fact that three different input potentials or input voltages are present at the three-stage converter in ongoing operation, wherein, through appropriate driving of the semiconductor switches of the three-stage converter, an output voltage can be established that in principle—if line and transmission losses are disregarded—extends from the smallest input voltage through the medium input voltage to the largest input voltage of the applicable three-stage converter. The three-stage converter, which represents a preferred embodiment of the multistage converter, is discussed again below within the framework of the figure description. Generally speaking, it is possible not only to implement the first and/or the additional multistage converters as three-stage converters, which is to say with three different supply voltages, but it is alternatively also possible for the multistage converter or converters to be implemented as four-stage converters or as N-stage converters, which is to say with four or N different supply voltages, for example with N=4, N=5, N=6, or N>6.

The inductive component provided in accordance with the inventive simulation device is preferably implemented as an electrical coil. It is optionally possible to provide for the electrical coil to be equipped with a ferrite core or an iron core. In addition, an electrical component for changing the inductance value of the inductive component can be provided in that the electrical component brings about, e.g., a displacement of a ferrite or iron core interacting with the coil.

It should be noted that an inductive reactance of the inductive component can have a non-negligible limiting effect on the first simulation current during a transition of one of the four semiconductor switches of the first multistage converter, for example, wherein preferably the model code and/or a control apparatus of the simulation device is designed to take into account and/or to compensate for the limiting effect. The fact that a limiting or increase of the simulation current during a running simulation is not of necessity caused solely by the simulation device is further clarified using the following figures and the figure description. The simulation device is therefore preferably equipped to take into account a potential gradient between one voltage at the first converter output and another voltage at the first control element output, in particular, which is achieved in an improvement of the invention through processing of the information concerning the first output voltage of the first control element during cyclic processing of the model code by the computing unit.

According to the present invention the simulation device includes, among other things, a computing unit for execution of model code. Fundamentally, any desired computer can be used as the computing unit as long as it is ensured that the computer has at least a minimum computing power matched to the relevant application, and suitable equipment, for example adequate working memory, wherein the computing power and the equipment of the computing unit must also suffice to ensure cyclic execution of the model code within a predefined cycle time. Preferably, the computing unit is real-time capable, wherein it is preferred in particular for the computing unit to be equipped with a so-called real-time operating system. It is especially preferred for both the real-time operating system and the model code to be implemented such that all necessary criteria of what is known as "hard real-time" are met during execution of the model code by the computing unit. In the context described, hard real-time means that, for example, the cyclic execution of the model code is guaranteed to take place within a predefined time interval, namely a predefined maximum cycle time. In the last-mentioned embodiment of the computing unit, which is hard real-time-capable, exceeding the predefined maximum cycle time, if the exceedance were to occur once, results in a system fault of the computing unit, which causes, e.g., an abnormal termination or a restart of the simulation.

The computing unit has at least one output for outputting the first switch control signal and optionally for outputting a second and/or third switch control signal.

The first switch control signal is provided by the computing unit for forwarding to a first semiconductor switch control during ongoing operation of the simulation device. The first semiconductor switch control is provided and equipped to convert the first switch control signal into at least a first modified switch control signal.

During ongoing operation of the simulation device, the first switch control signal is converted into at least a first modified switch control signal, which is to say that a signal conversion takes place within the first semiconductor switch control from the initially abstract first switch control signal to the first modified switch control signal that is intended for direct transmission to the control terminals of the semiconductor switches of the first control element.

Even though the first switch control signal already contains information about a desired switch state of at least one semiconductor switch of the first control element, the first switch control signal is not intended to be applied directly to one or more control terminals of the semiconductor switches of the first control element, because the first switch control signal is first converted into a first modified switch control signal having appropriately matched signal levels for control of the semiconductor switches of the first control element. In other words, this means that the information provided by the executed model code about a state of the first control element that is to be established is contained in the first switch control signal. The first semiconductor switch control is provided and equipped to convert the first switch control signal into a first modified switch control signal. Preferably, the modified switch control signal is applied directly to the control terminals of the first control element in order to achieve the switch state to be established in the first control element that is computed by the model code in each computation cycle. The first modified switch control signal is matched to the technical parameters of the semiconductor switches to be controlled, for example to their semiconductor switch gate-source voltage interval that is permissible or specified by a semiconductor switch manufacturer, wherein the example of the matched gate-source voltage interval applies in particular to those semiconductor switches that are implemented as field-effect transistors.

For the purpose of easier understanding of the present teaching, field-effect transistors are frequently cited hereinafter as embodiments of the semiconductor switches of the first control element and/or of the second control element and/or of the third control element, although as a general rule other embodiments of semiconductor switches, for example the "IGBT components" already mentioned, can also be used. A person skilled in the art, insofar as he has knowledge of the present invention, will easily choose suitable semiconductor switches, for example suitable FETs, for the control element or control elements of the simulation device while taking into account the electrical requirements for the simulation device.

Where a field-effect transistor is mentioned in the text below as an exemplary embodiment of a semiconductor switch of the first control element, of the second control element, and/or of the third control element, a signal controlling the applicable field-effect transistor of the first control element that includes the first modified control signal is referred to as a "gate-source voltage" of the field-effect transistor that is controlled thereby.

Preferably, the first modified switch control signal includes four gate-source voltages for driving preferably four control terminals of the first control element, wherein each gate-source voltage of the four gate-source voltages is associated with one corresponding control terminal of the first control element. In the preferred embodiment of the first control element, in which the first control element includes at least four semiconductor switches, it is preferred that each of the four gate-source voltages controlled through the model code is connected in each case to one of the four semiconductor switches, thus in the example is connected to one of the four field-effect transistors of the first control element.

Preferably, provision is made that by applying the first modified switch control signal, which has four gate-source voltages, to the field-effect transistors of the first multistage converter of the first control element, a first dynamically variable simulation current is established, which in particular is influenced by the computation results of the model code executed on the computing unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1C:
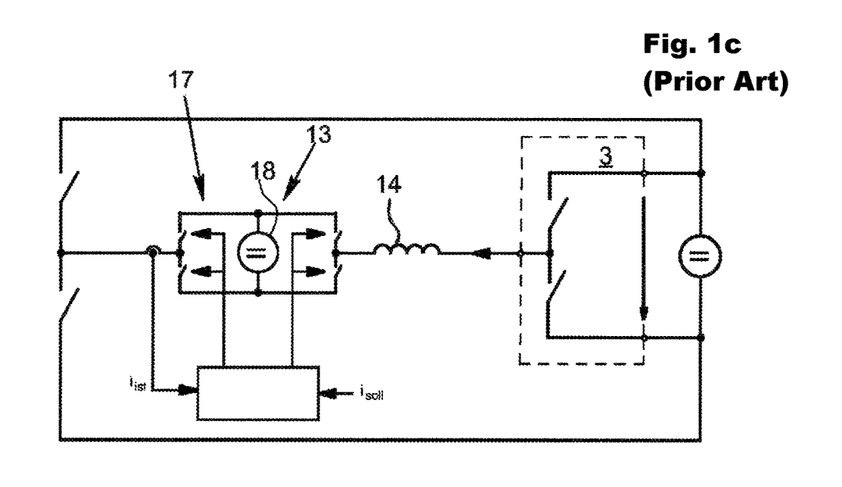
FIG. 1c is a circuit for emulating or simulating an electrical load at a terminal of a test circuit, as is already known from the document WO 2010 010022 A1.

FIGS. 1a, 1b, and 1c have already been covered within the framework of the introduction to the description in the discussion of the prior art. For this reason, further explanation of FIGS. 1a, 1b, 1c can be dispensed with in the text that follows.

Figure 2:
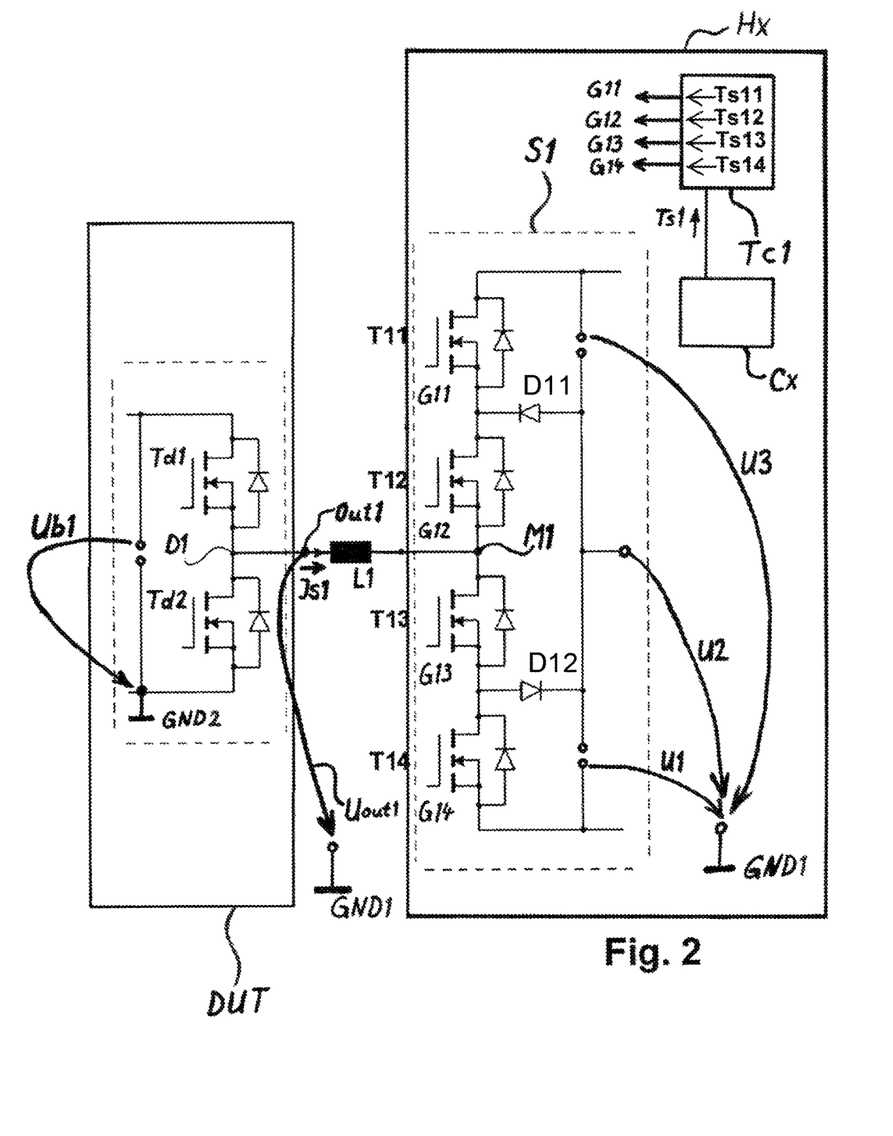
FIG. 2 is a schematic view of an embodiment of a simulation device according to the invention.

The illustration in FIG. 2 shows a view of a first embodiment of a simulation device Hx and a control device DUT electrically connected to the simulation device Hx.

The first control element S1 shown schematically in FIG. 2 includes at least four semiconductor switches, namely a first semiconductor switch T11 of the first control element S1, a second semiconductor switch T12 of the first control element S1, a third semiconductor switch T13 of the first control element S1, and a fourth semiconductor switch T14 of the first control element S1.

The last-mentioned four semiconductor switches T11, T12, T13, T14 are wired to one another and to a first supply voltage U1 or a second supply voltage U2 or a third supply voltage U3 such that the first control element S1 has a first multistage converter.

In especially preferred fashion, the at least four semiconductor switches of the first control element S1 are implemented as FETs. It is preferred here that these four semiconductor switches are connected to one another or to the first supply voltage U1 or the second supply voltage U2 or the third supply voltage U3 in the manner described as follows: The drain terminal of the first semiconductor switch T11 is connected to the third supply voltage U3; the source terminal of the first semiconductor switch T11 is connected to the drain terminal of the second semiconductor switch T12; the source terminal of the second semiconductor switch T12 and the drain terminal of the third semiconductor switch T13 and the terminal on the converter side of the first inductive component L1 are connected to one another; the source terminal of the third semiconductor switch T13 is connected to the drain terminal of the fourth semiconductor switch T14; the source terminal of the fourth semiconductor switch T14 is connected to the first supply voltage U1.

The control terminals G11, G12, G13, G14 of the first control element S1 are connected to corresponding outputs of a first semiconductor switch control Tc1.

The first control element S1 shown schematically in FIG. 2 additionally includes a first diode D11 and a second diode D12. The cathode of the first diode D11 is connected to the source terminal of the first semiconductor switch T11 and to the drain terminal of the second semiconductor switch T12. The anode of the first diode D11 can be connected to or is connected to the second supply voltage U2. During ongoing operation of the simulation device Hx, the second supply voltage U2 is present at the anode of the first diode D11. The anode of the second diode D12 is connected to the source terminal of the third semiconductor switch T13 and to the drain terminal of the fourth semiconductor switch T14. The cathode of the second diode D12 can be connected to or is connected to the second supply voltage. During ongoing operation of the simulation device Hx, the second supply voltage U2 is present at the cathode of the second diode D12.

In accordance with FIG. 2, the first control element S1 associated has been deleted in an otherwise identical paragraph in the document with Ref. No. 13-009-01-EP] includes the first semiconductor switch T11, the second semiconductor switch T12, the third semiconductor switch T13, and the fourth semiconductor switch 14, wherein preferably each of these four semiconductor switches is a so-called FET, which is to say a field-effect transistor. Normally, a so-called bulk terminal and the source terminal of the same FET are electrically connected. A so-called "body diode," which is also referred to as a "reverse diode," one of which is inherently present in each of the FETs, is shown in the drawing but without a reference symbol. As is shown in FIG. 2, in each of these four semiconductor switches T11, T12, T13, T14, one cathode of an associated body diode is electrically connected to an associated drain terminal, and one anode of an associated body diode is electrically connected to an associated source terminal. Because the body diodes are not material to the invention, they are not described in greater detail.

The first supply voltage U1, the second supply voltage U2, the third supply voltage U3, and a first output voltage Uout1 are each referenced to a first reference voltage GND1.

According to an embodiment, the second supply voltage U2 is equal to the first reference voltage GND1, wherein the third supply voltage U3 has a positive voltage value and the first supply voltage has a negative voltage value.

During the course of a signal conversion of the first switch control signal Ts1 by the first semiconductor switch control Tc1, the first modified switch control signal Ts11, Ts12, Ts13, Ts14 is produced. In accordance with the embodiment shown in FIG. 2 of the simulation device Hx with four semiconductor switches T11, T12, T13, T14 implemented as field-effect transistors, provision preferably is made that the first modified switch control signal has at least four gate-source voltages that are intended to be applied to preferably four control terminals G11, G12, G13, G14 of the first control element.

Each of the last-mentioned four gate-source voltages preferably is set with the first semiconductor switch control Tc1 as a function of the first switch control signal Ts1 such that a desired electrical potential arises at the first converter output M1. A potential gradient between the first load terminal D1 of the control device DUT and the first converter output M1 of the first control element S1 created by the electrical potential established at the first converter output M1 necessarily results in a first simulation current Is1 along the potential gradient.

Specifically, the last-mentioned four gate-source voltages include: a first gate-source voltage Ts11 of the first modified switch control signal controlling the first semiconductor switch T11; a second gate-source voltage Ts12 of the first modified switch control signal controlling the second semiconductor switch T12; a third gate-source voltage Ts13 of the first modified switch control signal controlling the third semiconductor switch T13; and a fourth gate-source voltage Ts14 of the first modified switch control signal controlling the fourth semiconductor switch T14.

For example, a preferably digitally coded first switch control signal Ts1 is generated cyclically as a function of a computation result of the cyclically processed model code, and from this is subsequently generated a corresponding cyclically variable first modified switch control signal that has four associated cyclically variable gate-source voltages of the first modified switch control signal Ts11, Ts12, Ts13, Ts14. By means of the four gate-source voltages of the first modified switch control signal Ts11, Ts12, Ts13, Ts14, one or more of the semiconductor switches T11, T12, T13, T14 of the first control element is or are, for example, brought from a blocking state to a conductive state or vice versa for a time computed by model code in order to thus set the first simulation current Is1 based on the computation result of the model code.

It is preferred for the computing unit Cx to have an input (not shown in the drawing) for reading in a measured value of the first output voltage Uout1 and/or a measured value of the first simulation current Is1. If the computing unit has a corresponding input for reading in the measured first output voltage Uout1 or for reading in the measured first simulation current Is1, provision preferably is made that the computing unit Cx makes a change in the first switch control signal Ts1 as a function of the first output voltage Uout1 or as a function of the first simulation current Is1 by means of the model code and taking into account the measured first output voltage Uout1 or taking into account the measured first simulation current Is1.

Figure 3:
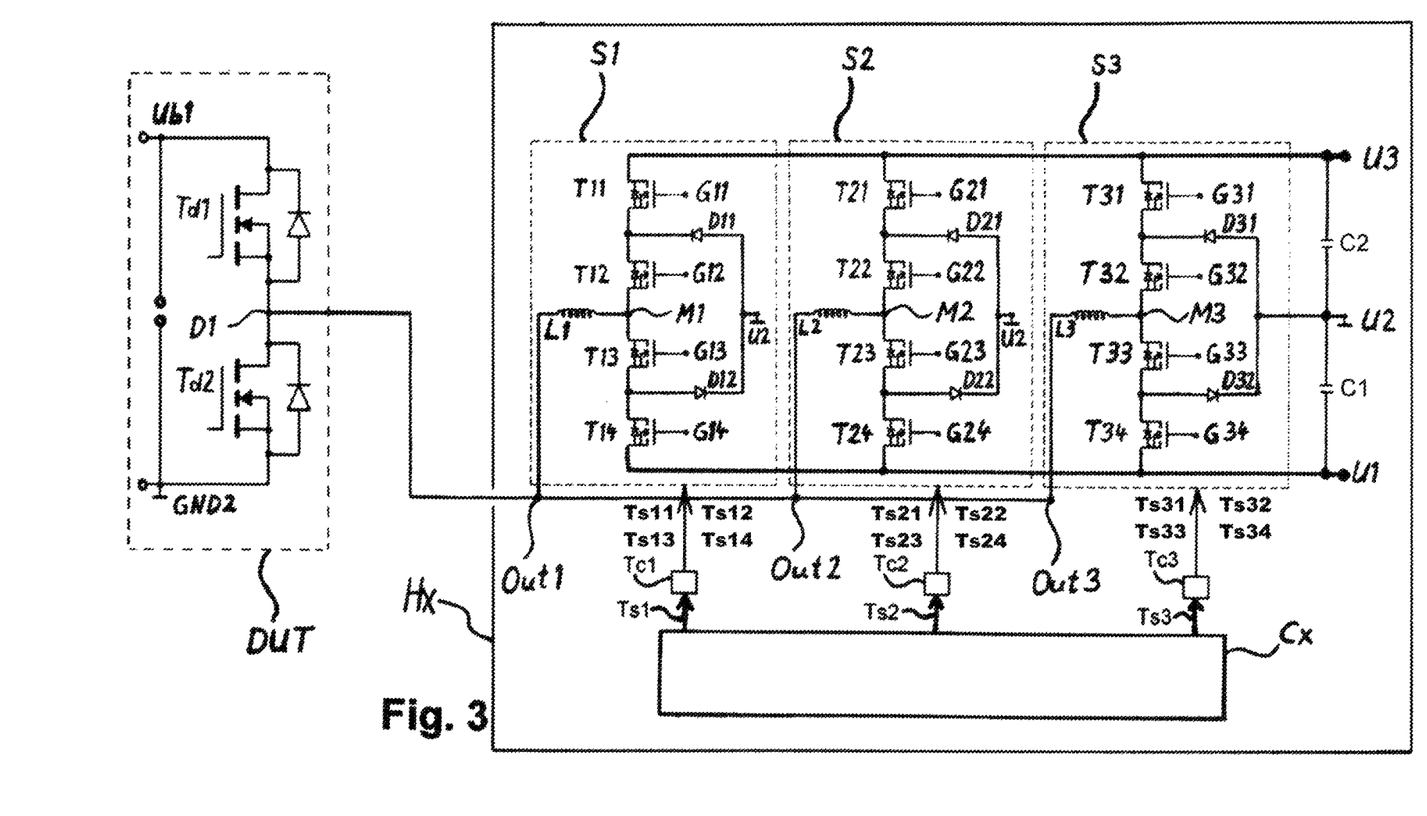
FIG. 3 is a schematic view of an embodiment of a simulation device according to the invention.

The exemplary embodiment of the simulation device Hx according to the invention disclosed in accordance with FIG. 3 shows, in addition to the first control element S1, a second control element S2 and a third control element S3. The simulation device Hx from FIG. 3 thus has a total of three control elements S1, S2, S3, which are essentially identical with respect to their structure in terms of hardware.

Preferably the semiconductor switches shown of the first control element S1, of the second control element S2, and of the third control element S3 are implemented as field-effect transistors, abbreviated as FETs.

In addition, it is preferred to supply the three control elements S1, S2, S3 shown in FIG. 3 of the simulation device Hx with the first supply voltage U1, the second supply voltage U2, and the third supply voltage U3.

In the exemplary embodiment in accordance with FIG. 3, the third supply voltage U3 is connected to the drain terminals of the first semiconductor switch T11 of the first control element S1, of the first semiconductor switch T21 of the second control element S2, and/or of the first semiconductor switch T31 of the third control element S3.

In the exemplary embodiment in accordance with FIG. 3, the second supply voltage U2 is connected via diode/s in the exemplary embodiment in FIG. 3 to the source terminals of the first semiconductor switch T11 of the first control element S1 via diode D11, of the first semiconductor switch T21 of the second control element S2 via diode D21, of the first semiconductor switch T31 of the third control element S3 via diode D31, wherein the anodes of the diodes D11, D21, and D31 are connected to the second supply voltage U2, of the third semiconductor switch T13 of the first control element S1 via diode D12, of the third semiconductor switch T23 of the second control element S2 via diode D22, of the third semiconductor switch T33 of the third control element S3 via diode D32, wherein the cathodes of the diodes D12, D22, and D32 are connected to the second supply voltage U2.

The second supply voltage U2 in the exemplary embodiment in accordance with FIG. 3 is connected via diode/s to the drain terminals of the second semiconductor switch T12 of the first control element S1 via diode D11, of the second semiconductor switch T22 of the second control element S2 via diode D21, of the second semiconductor switch T32 of the third control element S3 via diode D31, of the fourth semiconductor switch T14 of the first control element S1 via diode D12, of the fourth semiconductor switch T24 of the second control element S2 via diode D22, and of the fourth semiconductor switch T34 of the third control element S3 via diode D32.

The first supply voltage U1 is connected to the source terminals of the fourth semiconductor switch T14 of the first control element S1, of the fourth semiconductor switch T24 of the second control element S2, and of the fourth semiconductor switch T34 of the third control element S3.

In the exemplary embodiments in accordance with FIGS. 2 and 3, the first converter output M1 associated with the first control element S1, which is electrically connected to a terminal on the converter side of a first inductive component L1, also forms an electrical connection point to the source terminal of the second semiconductor switch T12 of the first control element S1 and the drain terminal of the third semiconductor switch T13 of the first control element S1.

In the exemplary embodiment in accordance with FIG. 3, a second converter output M2 associated with the second control element S2, which is electrically connected to a terminal on the converter side of a second inductive component L2, also forms an electrical connection point to the source terminal of the second semiconductor switch T22 of the second control element S2 and the drain terminal of the third semiconductor switch T23 of the second control element S2.

In the exemplary embodiment in accordance with FIG. 3, a third converter output M3 associated with the third control element S3, which is electrically connected to a terminal on the converter side of a third inductive component L3, also forms an electrical connection point to the source terminal of the second semiconductor switch T32 of the third control element S3 and the drain terminal of the third semiconductor switch T33 of the third control element S3.

The computing unit Cx of the embodiment of the simulation device Hx in accordance with FIG. 3 provides the first switch control signal Ts1, the second switch control signal Ts2, and the third switch control signal Ts3 by means of the model code cyclically executed on the computing unit Cx in every cycle of the model code execution.

In the embodiment in accordance with FIG. 3, as in the embodiment in accordance with FIG. 2, the first switch control signal Ts1 is converted by the first semiconductor switch control Tc1 into the first modified switch control signal Ts11, Ts12, Ts13, Ts14. In a similar manner, it is shown in FIG. 3 that nonspecific—with respect to a form of a semiconductor switch—switch control signals, namely the first switch control signal Ts1, the second switch control signal Ts2, and the third switch control signal Ts3, are converted into semiconductor switch-specific, which is to say modified, switch control signals, for example gate-source voltages for FETs, which are proposed as preferred semiconductor switches of the first control element S1, of the second control element S2, and/or of the third control element S3.

In one embodiment of the invention in accordance with FIG. 3, the first multistage converter of the first control element S1 and the second multistage converter of the second control element S2 and the third multistage converter of the third control element S3 are constructed using FETs, and consequently the control terminals of the first control element S1, of the second control element S2, and of the third control element S3 are implemented as gate terminals of the FETs.

It is demonstrated as part of the present figure description, in particular with the use of the embodiments of the simulation device Hx according to the invention shown in FIGS. 2 and 3, that after a conversion of the first switch control signal Ts1 by the first semiconductor switch control Tc1 into the first modified switch control signal Ts11, Ts12, Ts13, Ts14; preferably after a conversion of a second switch control signal Ts2 by the second semiconductor switch control Tc2 into a second modified switch control signal Ts21, Ts22, Ts23, Ts24; preferably after a conversion of a third switch control signal Ts3 by the third semiconductor switch control Tc3 into a third modified switch control signal Ts31, Ts32, Ts33, Ts34, an application of the first modified switch control signal Ts11, Ts12, Ts13, Ts14 to the first control element S1; preferably, an application of the second modified switch control signal Ts21, Ts22, Ts23, Ts24 to the second control element S2; or preferably, an application of the third modified switch control signal Ts31, Ts32, Ts33, Ts34 to the third control element S3 takes or take place.

If, for example, the semiconductor switches of the first control element S1 are implemented as FETs, as schematically shown in FIG. 2 and in FIG. 3, then preferably gate-source voltages of the first control element S1 are arranged as follows: A first control terminal G11 has a corresponding first gate-source voltage Ts11 applied to it, a second control terminal G12 has a corresponding second gate-source voltage Ts12 applied to it, a third control terminal G13 has a corresponding third gate-source voltage Ts13 applied to it, and a fourth control terminal G14 has a corresponding fourth gate-source voltage Ts14 applied to it, wherein the last-mentioned four gate-source voltages preferably are included in the first modified switch control signal Ts11, Ts12, Ts13, Ts14.

In the embodiment in accordance with FIG. 3, the second switch control signal Ts2 is converted by the second semiconductor switch control Tc2 into a second modified switch control signal Ts21, Ts22, Ts23, Ts24, which has a semiconductor-switch-specific gate-source voltage for each of the four semiconductor switches T21, T22, T23, T24 shown of the second control element S2.

If, for example, the semiconductor switches of the second control element S2 are implemented as FETs, as schematically shown in FIG. 3, then preferably gate-source voltages of the second control element S2 are arranged as follows: a fifth control terminal G21 has a corresponding fifth gate-source voltage Ts21 applied to it, a sixth control terminal G22 has a corresponding sixth gate-source voltage Ts22 applied to it, a seventh control terminal G23 has a corresponding seventh gate-source voltage Ts23 applied to it, and an eighth control terminal G24 has a corresponding eighth gate-source voltage Ts24 applied to it, wherein the last-mentioned four gate-source voltages preferably are included in the second modified switch control signal Ts21, Ts22, Ts23, Ts24.

In the embodiment in accordance with FIG. 3, the third switch control signal Ts3 is converted by the third semiconductor switch control Tc3 into a third modified switch control signal Ts21, Ts22, Ts23, Ts24, which has a semiconductor-switch-specific gate-source voltage for each of the four semiconductor switches T31, T32, T33, T34 shown of the third control element S3.

If, for example, the semiconductor switches of the third control element S3 are implemented as FETs, as schematically shown in FIG. 3, then preferably gate-source voltages of the third control element S3 are arranged as follows: a ninth control terminal G31 has a corresponding ninth gate-source voltage Ts31 applied to it, a tenth control terminal G32 has a corresponding tenth gate-source voltage Ts32 applied to it, an eleventh control terminal G33 has a corresponding eleventh gate-source voltage Ts33 applied to it, and a twelfth control terminal G34 has a corresponding twelfth gate-source voltage Ts34 applied to it, wherein the last-mentioned four gate-source voltages preferably are included in the third modified switch control signal Ts31, Ts32, Ts33, Ts34.

In an exemplary embodiment of the simulation device Hx in accordance with FIG. 3 it is preferred that the first control element output Out1, which is formed by the terminal on the control device side of the first inductive component L1, and the second control element output Out2, which is formed by the terminal on the control device side of the second inductive component L2, and the third control element output Out3, which is formed by the terminal on the control device side of the third inductive component L3.

Moreover, in the exemplary embodiment in accordance with FIG. 3 it is preferred that the first control element output Out1 and the second control element output Out2 and the third control element output Out3 are electrically connected to one another by an electrical jumper, and the electrical jumper is provided and equipped to be connected to the first load terminal D1 of the control device DUT.

The additional advantage resulting from the circuit arrangement in accordance with FIG. 3 resides in that the currents flowing through the first load terminal D1 can be emulated especially precisely by means of the simulation device Hx.

In the exemplary embodiment in accordance with FIG. 3 a first capacitor C1 and a second capacitor C2 preferably are connected to the three last-mentioned supply voltages U1, U2, U3 for smoothing of the first supply voltage U1 and of the third supply voltage U3, and specifically as follows: A first electrode of the first capacitor C1 is connected to the first supply voltage U1, and a second electrode of the first capacitor C1 is connected to the second supply voltage U2, and a first electrode of the second capacitor C2 is connected to the second supply voltage U2, and a second electrode of the second capacitor C2 is connected to the third supply voltage U3.

In an embodiment of the simulation device Hx according to the invention, provision is made that the first multistage converter has at least a first, a second, a third, a fourth semiconductor switch T11, T12, T13, T14, wherein the first, the second, the third, the fourth semiconductor switch T11, T12, T13, T14 includes, in each case, at least one control terminal G11, G12, G13, G14, and wherein a first output voltage Uout1 influenced by the model code can be provided at the first control element output Out1 connected to the first multistage converter. It is an advantage of the last-mentioned embodiment that, by means of the first multistage converter, to whose four semiconductor switches T11, T12, T13, T14 the first modified switch control signal Ts11, Ts12, Ts13, Ts14 is applied, can be achieved cost-effectively and, moreover, highly dynamically variable current changes of the first simulation current Is1 calculated by the model code can be provided.

In accordance with another improvement of the simulation device Hx according to the invention, said device additionally has a second control element S2 and a third control element S3, wherein the second control element S2 is implemented as a second multistage converter and/or wherein the third control element S3 is implemented as a third multistage converter.

In the last-mentioned improvement of the simulation device Hx, the second control element S2 and the third control element S3 advantageously stand ready, along with the first control element S1, to implement an addition of output current of the first control element S1 plus output current of the second control element S2 plus output current of the third control element S3 by means of an electrical connection of the first control element output Out1, the second control element output Out2, and the third control element output Out3, wherein the total current resulting from the addition can be delivered to a first load terminal D1 of the control device DUT, such as is provided, for example, by means of a preferred simulation device Hx in accordance with FIG. 3. This total current is, as a general rule, more dynamically variable than a first simulation current Is1 that, for example, is delivered to a first load terminal D1 in accordance with FIG. 2 by a single first control element S1, which is to say without any addition to another output current from another control element.

The more dynamically a simulation current Is1 that is deliverable to the first load terminal D1 of the control device DUT can be varied by means of the simulation device Hx, the more realistically the simulation device Hx will be able to simulate, for test purposes, currents that will flow through the first load terminal D1 of the control device DUT in a later "actual" use.

In an embodiment of the simulation device Hx according to the invention, the first multistage converter and/or the second multistage converter and/or the third multistage converter is or are implemented as three-stage converters. Surprisingly, an especially advantageous cost-benefit ratio is established for a simulation device Hx when at least the second multistage converter, which is included in the second control element S2, and optionally also the third multistage converter, which is included in the third control element S3, is or are implemented as three-stage converters. In particular, the highly dynamic nature of the last-mentioned total current achievable by means of the three-stage converter enters into the evaluation of the benefit here.

An embodiment of the simulation device Hx is especially preferred in which the second control element S2 is implemented as a second three-stage converter having a second group of at least four semiconductor switches T21, T22, T23, T24 and a second control element output Out2, and wherein the third control element S3 is implemented as a third three-stage converter having a third group of at least four semiconductor switches T31, T32, T33, T34 and a third control element output Out3, and the first control element output Out1 and the second control element output Out2 and the third control element output Out3 are electrically connected to one another.

In an embodiment of the simulation device Hx, during a cyclic execution of the model code on the computing unit Cx, provision is made for the model code at predefined time intervals to process a state message provided by the control device DUT, containing information that reflects an upcoming or completed state change of a first driver transistor Td1 of the control device DUT or an upcoming or completed state change of a second driver transistor Td2 of the control device DUT, in order to influence at least the first control element S1. This last-mentioned improvement of the simulation device Hx advantageously opens up an option to influence at least a first control element S1 either earlier or based on an enlarged database.

In an embodiment of the last-mentioned improvement of the simulation device Hx, a generation of the state message is provided at each measurement time of a measurement of the first output voltage Uout1, and/or the state message is placed in a causal relationship with a measured value of the measurement of the first output voltage Uout1 at the measurement time of the associated measurement of the first output voltage Uout1

Additionally, in a further embodiment of the simulation device Hx, provision can be made that in one of the two last-mentioned embodiments of the simulation device Hx, the state message can be provided at predefined time intervals by a control device microprocessor (not shown in the drawing) associated with the control device DUT by means of control code that can be executed on the control device microprocessor. The last-mentioned embodiment permits especially early adaptation of the switching state of the simulation device Hx to a variable first simulation current Is1, because the information about the state changes of the first driver transistor Td1 and of the second driver transistor Td2 of the control device DUT normally is first present in a control device microprocessor associated with the control device, since the control code is executed by means of the control device microprocessor in the control device DUT. Preferably, the control of the first driver transistor Td1 and of the second driver transistor Td2 takes place as a function of the computation result of the executed control code, in particular.

Preferably, the state message transmitted from the control device DUT to the simulation device Hx is further processed in the computing unit Cx of the simulation device Hx in order to exert a controlling influence on the switching states of the semiconductor switches T11, T12, T13, T14 associated with the first control element S1.

In another embodiment of the simulation device Hx according to the invention, the first control element S1 includes at least a first supply voltage terminal having a first supply voltage U1 and a second supply voltage terminal having a second supply voltage U2, and a third supply voltage terminal having a third supply voltage U3, wherein the third supply voltage U3 is greater than the second supply voltage U2, which is greater than the first supply voltage U1, wherein the first output voltage Uout1 can be set between the third supply voltage U3 and the first supply voltage U1 by an application of the first switch control signal Ts1 to the control terminals G11, G12, G13, G14 of the first control element S1, and wherein the first output voltage Uout1 is referenced to a first reference voltage GND1.

In accordance with an additional embodiment of the simulation device Hx according to the invention, an auxiliary signal connection (not shown in the drawing) is established or can be established from the computing unit Cx of the simulation device Hx to a control device microprocessor included in the control device DUT in order to influence the first and/or the second and/or the third switch control signal Ts1, Ts2, Ts3 as a function of information transmitted from the control device microprocessor to the computing unit Cx via auxiliary signal connection. The auxiliary signal connection reduces the load with respect to an available bandwidth of an optionally provided additional signal connection that is provided or can be provided for the purpose of data exchange between the control device DUT and the simulation device Hx. Both the auxiliary signal connection and the additional signal connection are optionally implemented as bidirectional data connections. Both the auxiliary signal connection and the additional signal connection can have electrical connecting lines, optical cables, and/or a radio connection, for example WLAN, as connecting media.

If the first control element S1 has at least a first supply voltage terminal having a first supply voltage U1 and a second supply voltage terminal having a second supply voltage U2 and a third supply voltage terminal having a third supply voltage U3, provision is made in an especially preferred embodiment of the simulation device Hx that, within the first control element S1, with reference to a first reference voltage GND1, the third supply voltage U3 has a positive voltage value, and the first supply voltage U1 has a negative voltage value, and furthermore the following quantity relations apply: the second supply voltage U2 is identical to the first reference voltage GND1, which is to say U2=GND1; the second supply voltage U2 has an identical voltage difference in terms of magnitude both to the third supply voltage U3 and to the first supply voltage U1, which is to say $|U3-U2|=|U2-U1|$; the second reference voltage GND2 is greater than the first supply voltage U1 and less than the second supply voltage U2, which is to say U1<GND2<U2; a fourth supply voltage Ub1 is greater than the second supply voltage U2 and less than the third supply voltage U3, which is to say U2<Ub1<U3; the difference formed from the fourth supply voltage Ub1 as minuend and the second supply voltage U2 as subtrahend is identical to the difference formed from the second supply voltage U2 as minuend and the second reference voltage GND2 as subtrahend, which is to say Ub1−U2=U2−GND2.

The last-mentioned embodiment can be used to advantage for an especially large number of simulation scenarios having practical relevance. Surprisingly, because of the symmetry in the last-mentioned embodiment and described in the equations $|U3-U2|=|U2-U1|$ and $|Ub1-U2=U2-GND2|$ it also turns out that model code with a less complex structure is needed for the simulation device Hx to simulate the peripheral circuit arrangement than would have been the case without the symmetry described with the last-mentioned equation. In one embodiment an electrochemical energy storage device, for example a storage battery, can be provided in order to provide the fourth supply voltage Ub1.

The method according to the invention for simulating a peripheral circuit arrangement that can be connected to a control device DUT is based on a simulation device Hx that is electrically connected or can be electrically connected to the control device DUT, wherein the simulation device Hx has a first control element S1 with which a first simulation current Is1 that can be passed from a first load terminal D1 of the control device DUT to a first control element output Out1 of the first control element S1 is influenced. The first control element S1 contains a first multistage converter, wherein the first multistage converter includes a first converter output M1, wherein, connected to the first converter output M1, is a first inductive component L1 at whose terminal on the control device side the first control element output Out1 is implemented. The direction of flow of the first simulation current Is1 is reversed by voltage change at the first control element output Out1. The simulation device Hx also includes a computing unit Cx that executes model code, wherein by means of the model code executed on the computing unit Cx, a first switch control signal Ts1 is provided for forwarding to a first semiconductor switch control Tc1. The first semiconductor switch control Tc1 converts the first switch control signal Ts1 into at least a first modified switch control signal Ts11, Ts12, Ts13, Ts14, and at least the first modified switch control signal Ts11, Ts12, Ts13, Ts14 is applied to the first multistage converter. A first output voltage Uout1 influenced by the model code is provided at the first control element output Out1 connected to the first multistage converter.

Using embodiments of the simulation device Hx according to the invention, FIG. 2 and FIG. 3 show components preferably involved in the method that have an operative connection with regard to the method.

A particular advantage of the method according to the invention is that the first multistage converter of the first control element S1 influences the first simulation current Is1 through the first semiconductor switch control Tc1 with an especially short delay once a corresponding request for changing the first simulation current Is1 has been calculated by means of the model code on the computing unit Cx, whereupon a corresponding first switch control signal Ts1 is output by the computing unit Cx to the first semiconductor switch control Tc1. Achieving a desired change in the first simulation current Is1 with the least possible delay by means of the simulation device Hx is advantageous because the behavior of numerous peripheral circuit arrangements, which can include, e.g., inductive loads, can thus be emulated in a sufficiently precise manner. It is also advantageous that the method according to the invention can be executed using a simulation device Hx that can be achieved relatively cost-effectively and model code that is relatively uncomplicated in design, and hence cost-effective.

In a preferred improvement of the method according to the invention, the method is executed on a simulation device Hx according to one of claims 1 to 9. The advantages of the last-mentioned improvement are improved results of the simulation, in particular based on a reduced delay in an achievement of a change of the first simulation current Is1 and/or a change of the first output voltage Uout1 of the first control element S1.

In another improvement of the method, the model code is executed cyclically a number Nx times at fixed time intervals, which is to say at time intervals that are constant over time, by means of the computing unit Cx, and within each of the Nx fixed time intervals, each of the first switch control signal Ts1 for forwarding to the first semiconductor switch control Tc1 and/or the second switch control signal Ts2 for forwarding to the second semiconductor switch control Tc2 and/or the third switch control signal Ts3 for forwarding to the third semiconductor switch control Tc3 is or are calculated.

An advantage of the cyclic execution of the model code and the cyclic calculation of the first and/or second and/or third switch control signal(s) is that the simulation device Hx preferably responds in each cycle to a current change and/or voltage change on at least one interface of the control device DUT.

The cycle times in which the first switch control signal Ts1, the second switch control signal Ts2, and/or the third switch control signal Ts3 is/are calculated by means of the model code preferably are a few milliseconds or preferably even lie in the range of a few microseconds. A trend in the field of HIL simulations mentioned at the outset is to no longer compute the executable model code solely by means of microprocessors, but instead increasingly to displace time-critical parts of the model code and time-critical executable sub-models to FPGA components or similar hardware components with programmable logic, by which even cycle times of less than one microsecond are achievable for the part of the model code running on the FPGA.

In accordance with another embodiment of the method according to the invention, the first switch control signal Ts1 is calculated by means of the model code as a function of a measured current value of the first simulation current Is1 and/or a measured voltage value of the first output voltage Uout1.

A particular advantage of the last-mentioned embodiment is that no exchange of digital data between the control device DUT and the simulation device Hx needs to take place in order to simulate the peripheral circuit arrangement, because the last-mentioned measured current value or the last-mentioned measured voltage value in this embodiment preferably includes sufficient information about the switching states of the first driver transistor Td1 and/or the second driver transistor Td2 for computation of the model code.

In another embodiment of the method starting from an Nth computation cycle of the model code, a measured current value of the first simulation current Is1 and/or a measured voltage value of the first output voltage Uout1 is or are measured in the Nth computation cycle, and in an (N+1)th computation cycle, the measured current value and/or the measured voltage value enter into the computation of the first switch control signal Ts1 by means of the model code in order to reduce a deviation of the measured current value of the first simulation current Is1 and/or in order to reduce a deviation of the measured voltage value of the first output voltage Uout1 from a corresponding ideal value conforming with the model code, wherein the (N+1)th computation cycle is the computation cycle that directly follows the Nth computation cycle.

A further advantage that results from the last-mentioned embodiment of the method is that a maximum time offset equal to one computation cycle time occurs between a determination of an actual value with regard to the simulation current Is1 and/or with regard to the first output voltage Uout1 on the one hand, and a corresponding computation of a correction by means of the model code with regard to the simulation current Is1 and/or with regard to the first output voltage Uout1 on the other hand, which leads to an improvement in the simulation results.

In a preferred use of the simulation device (Hx) according to the invention, the device is employed as a so-called "hardware-in-the-loop simulation device," also referred to by technical experts as an HIL simulator. The computation of the model variables by means of the model code preferably takes place in real time in this case.

In summary, the advantages of the simulation device according to the invention and the method according to the invention includes that an improved, in particular more realistic, simulation of a peripheral circuit arrangement that can be connected to a control device is made possible. The disadvantages of the prior art stated at the outset are at least partially lessened or avoided by means of the simulation device according to the invention and by means of the method according to the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A simulation device for simulating a peripheral circuit arrangement connectable to a control device, wherein the simulation device is electrically connectable to the control device, the simulation device comprising:
    a first control element controlling a first simulation current, the first simulation current passing from a first load terminal of the control device to a first control element output of the first control element, the first control element having a first multistage converter, the first multistage converter having a first converter output electrically connected to a terminal on a converter side of a first inductive component, the first control element having a first supply voltage terminal having a first supply voltage, a second supply voltage terminal having a second supply voltage, and a third supply voltage terminal having a third supply voltage, wherein a terminal of the first inductive component is implemented on the control device side the first control element output, wherein a direction of flow of the first simulation current is reversible by the first control element; and
    a computing unit adapted to execute a model code,
    wherein, via the model code that is stored and executable on the computing unit, a first switch control signal is provided for forwarding to a first semiconductor switch control,
    wherein the first semiconductor switch control is adapted to convert the first switch control signal into at least a first modified switch control signal and to apply at least the first modified switch control signal to the first multistage converter,
    wherein the first output voltage is adapted to be set between the third supply voltage and the first supply voltage by application of the first switch control signal to the first multistage converter of the first control element,
    wherein the first multistage converter has a first semiconductor switch, a second semiconductor switch, a third semiconductor switch, and a fourth semiconductor switch, wherein the first semiconductor switch, the second semiconductor switch, the third semiconductor switch, and the fourth semiconductor switch each include a control terminal, and
    wherein a cyclical execution of the model code controls the first semiconductor switch, the second semiconductor switch, the third semiconductor switch, and the fourth semiconductor switch, via the first switch control signal and the first semiconductor switch control, to set the first output voltage.

2. The simulation device according to claim 1, wherein the first output voltage influenced by the model code is provided at the first control element output connected to the first multistage converter.

3. The simulation device according to claim 1, wherein the simulation device also has a second control element and a third control element, and wherein the second control element is implemented as a second multistage converter and/or wherein the third control element is implemented as a third multistage converter.

4. The simulation device according to claim 3, wherein the first multistage converter and/or the second multistage converter and/or the third multistage converter are three-stage converters.

5. The simulation device according to claim 3, wherein the second control element is a second three-stage converter having a second group of at least four semiconductor switches and a second control element output, wherein the third control element is a third three-stage converter having a third group of at least four semiconductor switches and a third control element output, and wherein the first control element output and the second control element output and the third control element output are electrically connected to one another.

6. The simulation device according to claim 1, wherein, during the cyclical execution of the model code on the computing unit, the model code at predefined time intervals is adapted to process a state message provided by the control device containing information that reflects an upcoming or completed state change of a first driver transistor of the control device or an upcoming or completed state change of a second driver transistor of the control device to influence at least the first control element.

7. The simulation device according to claim 6, wherein a generation of the state message is provided at each measurement time of a measurement of the first output voltage and/or the state message is placed in a causal relationship with a measured value of the measurement of the first output voltage at the measurement time of the associated measurement of the first output voltage.

8. The simulation device according to claim 6, wherein the state message is adapted to be provided at predefined time intervals by a control device microprocessor associated with the control device via control code executable on the control device microprocessor.

9. The simulation device according to claim 1,
    wherein the third supply voltage is greater than the second supply voltage,
    wherein the second supply voltage is greater than the first supply voltage, and
    wherein the first output voltage is referenced to a first reference voltage.

10. The simulation device according to claim 9, wherein, within the first control element, with reference to the first reference voltage, the third supply voltage has a positive voltage value, and the first supply voltage has a negative voltage value, and wherein the following quantity relations apply:
    the second supply voltage is identical to the first reference voltage;
    the second supply voltage has an identical voltage difference in terms of magnitude both to the third supply voltage and to the first supply voltage;
    the second reference voltage is greater than the first supply voltage and less than the second supply voltage;
    the fourth supply voltage is greater than the second supply voltage and less than the third supply voltage; and a difference formed from the fourth supply voltage as minuend and the second supply voltage as subtrahend is identical to the difference formed from the second supply voltage as minuend and the second reference voltage as subtrahend.

11. The simulation device according to claim 1, wherein an auxiliary signal connection is established from the computing unit of the simulation device to a control device microprocessor included in the control device to influence the first switch control signal and/or a second switch control signal and/or a third switch control signal as a function of information transmitted from the control device microprocessor to the computing unit via auxiliary signal connection.

12. The simulation device according to claim 1, wherein the control device is provided with the simulation current over the first load terminal, and
wherein only the first load terminal connects the control device and the simulation device.

13. A method for simulating a peripheral circuit arrangement adapted to be connected to a control device, the method comprising:
providing a simulation device that is electrically connected to the control device, the simulation device having a first control element that controls a first simulation current that is passed from a first load terminal of the control device to a first control element output of the first control element;
providing the first control element with a first multistage converter, the first multistage converter having a first converter output, the first control element having a first supply voltage terminal having a first supply voltage, a second supply voltage terminal having a second supply voltage, and a third supply voltage terminal having a third supply voltage;
connecting to the first converter output a first inductive component, the first control element output being at a terminal on a control device side of the first inductive component;
reversing a direction of flow of the first simulation current via a voltage change at the first control element output;
executing a model code via a computing unit, wherein, via the model code executed on the computing unit, a first switch control signal is provided for forwarding to a first semiconductor switch control;
converting, via the first semiconductor switch control, a first switch control signal into at least a first modified switch control signal;
applying the at least the first modified switch control signal to the first multistage converter; and
controlling a first output voltage by the model code, the first output voltage being provided at the first control element output connected to the first multistage converter,
wherein the first output voltage is adapted to be set between the third supply voltage and the first supply voltage by application of the first switch control signal to the first multistage converter of the first control element,
wherein the first multistage converter has a first semiconductor switch, a second semiconductor switch, a third semiconductor switch, and a fourth semiconductor switch, wherein the first semiconductor switch, the second semiconductor switch, the third semiconductor switch, and the fourth semiconductor switch each include a control terminal, and
wherein a cyclical execution of the model code controls the first semiconductor switch, the second semiconductor switch, the third semiconductor switch, and the fourth semiconductor switch, via the first switch control signal and the first semiconductor switch control, to set the first output voltage.

14. The method according to claim 13, wherein the method is executed on the simulation device.

15. The method according to claim 13, wherein the model code is executed cyclically a number Nx times at fixed time intervals by the computing unit, and within each of the Nx fixed time intervals:
the first switch control signal for forwarding to the first semiconductor switch control is calculated; and/or
a second switch control signal for forwarding to a second semiconductor switch control is calculated; and/or
a third switch control signal for forwarding to a third semiconductor switch control is calculated.

16. The method according to claim 13, wherein the first switch control signal is calculated by the model code as a function of a measured current value of the first simulation current and/or a measured voltage value of the first output voltage.

17. The method according to claim 13, wherein, starting from an Nth computation cycle of the model code, a measured current value of the first simulation current and/or a measured voltage value of the first output voltage is measured in the Nth computation cycle, wherein, in an (N+1)th computation cycle, the measured current value and/or the measured voltage value is entered into the computation of the first switch control signal by the model code in order to reduce a deviation of the measured current value of the first simulation current and/or in order to reduce a deviation of the measured voltage value of the first output voltage from a corresponding ideal value conforming with the model code, and wherein the (N+1)th computation cycle is the computation cycle that directly follows the Nth computation cycle.

* * * * *